United States Patent
Marimuthu et al.

(10) Patent No.: US 9,443,797 B2
(45) Date of Patent: Sep. 13, 2016

(54) SEMICONDUCTOR DEVICE HAVING WIRE STUDS AS VERTICAL INTERCONNECT IN FO-WLP

(71) Applicant: STATS ChipPAC, Ltd., Singapore (SG)

(72) Inventors: Pandi C. Marimuthu, Singapore (SG); Sheila Marie L. Alvarez, Singapore (SG); Yaojian Lin, Singapore (SG); Jose A. Caparas, Singapore (SG); Yang Kern Jonathan Tan, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 13 days.

(21) Appl. No.: 13/832,781

(22) Filed: Mar. 15, 2013

(65) Prior Publication Data
US 2014/0077364 A1 Mar. 20, 2014

Related U.S. Application Data

(60) Provisional application No. 61/701,419, filed on Sep. 14, 2012.

(51) Int. Cl.
*H01L 21/56* (2006.01)
*H01L 23/00* (2006.01)
(Continued)

(52) U.S. Cl.
CPC ......... *H01L 23/49811* (2013.01); *H01L 21/56* (2013.01); *H01L 23/5389* (2013.01); *H01L 24/19* (2013.01); *H01L 24/20* (2013.01); *H01L 24/24* (2013.01); *H01L 24/82* (2013.01); *H01L 25/105* (2013.01); *H01L 21/563* (2013.01); *H01L 21/568* (2013.01); *H01L 23/3128* (2013.01); *H01L 23/49816* (2013.01); *H01L 25/0657* (2013.01); *H01L 2224/0558* (2013.01); *H01L 2224/11849* (2013.01); *H01L 2224/11901* (2013.01); *H01L 2224/12105* (2013.01); *H01L 2224/131* (2013.01); *H01L 2224/1308* (2013.01);
(Continued)

(58) Field of Classification Search
CPC ............. H01L 21/563; H01L 25/0657; H01L 2224/0558; H01L 2224/1308; H01L 2224/16145; H01L 2224/49174; H01L 2224/73253; H01L 2225/06555; H01L 2225/06562
USPC ................ 257/686, 723, 737, 787, E23.085, 257/E23.116, E23.178
See application file for complete search history.

(56) References Cited

U.S. PATENT DOCUMENTS 4,955,523 A   9/1990   Carlomagno et al.
5,371,654 A   12/1994  Beaman et al.
(Continued)

*Primary Examiner* — Ida M Soward
(74) *Attorney, Agent, or Firm* — Robert D. Atkins; Patent Law Group: Atkins and Associates, P.C.

(57) ABSTRACT

A semiconductor device has a substrate and semiconductor die disposed over a first surface of the substrate. A wire stud is attached to the first surface of the substrate. The wire stud includes a base portion and stem portion. A bonding pad is formed over a second surface of the substrate. An encapsulant is deposited over the substrate, semiconductor die, and wire stud. A portion of the encapsulant is removed by LDA to expose the wire stud. A portion of the encapsulant is removed by LDA to expose the substrate. An interconnect structure is formed over the encapsulant and electrically connected to the wire stud and semiconductor die. A bump is formed over the interconnect structure. A semiconductor package is disposed over the encapsulant and electrically connected to the substrate. A discrete semiconductor device is disposed over the encapsulant and electrically connected to the substrate.

16 Claims, 16 Drawing Sheets

(51) Int. Cl.
*H01L 25/00* (2006.01)
*H01L 23/498* (2006.01)
*H01L 23/538* (2006.01)
*H01L 25/10* (2006.01)
*H01L 25/065* (2006.01)
*H01L 23/31* (2006.01)

(52) U.S. Cl.
CPC ............. *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16145* (2013.01); *H01L 2224/16225* (2013.01); *H01L 2224/16227* (2013.01); *H01L 2224/24227* (2013.01); *H01L 2224/25171* (2013.01); *H01L 2224/2919* (2013.01); *H01L 2224/48091* (2013.01); *H01L 2224/48227* (2013.01); *H01L 2224/48247* (2013.01); *H01L 2224/49174* (2013.01); *H01L 2224/73253* (2013.01); *H01L 2224/73265* (2013.01); *H01L 2224/73267* (2013.01); *H01L 2224/821* (2013.01); *H01L 2224/82039* (2013.01); *H01L 2225/06555* (2013.01); *H01L 2225/06562* (2013.01); *H01L 2225/1023* (2013.01); *H01L 2225/1035* (2013.01); *H01L 2225/1041* (2013.01); *H01L 2225/1058* (2013.01); *H01L 2225/1082* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01)

(56) References Cited

U.S. PATENT DOCUMENTS

| | | |
|---|---|---|
| 5,455,390 A | 10/1995 | DiStefano et al. |
| 5,495,667 A | 3/1996 | Farnworth et al. |
| 5,601,740 A | 2/1997 | Eldridge et al. |
| 6,133,072 A | 10/2000 | Fjelstad |
| 6,207,549 B1 | 3/2001 | Higashi et al. |
| 6,476,503 B1 | 11/2002 | Imamura et al. |
| 6,477,768 B1 | 11/2002 | Wildner |
| 6,690,090 B2 | 2/2004 | Kimura |
| 6,972,496 B2 | 12/2005 | Choi |
| 7,227,095 B2 | 6/2007 | Roberts et al. |
| 7,497,694 B2 | 3/2009 | Kariya et al. |
| 7,608,921 B2 | 10/2009 | Pendse |
| 7,642,128 B1* | 1/2010 | Lin ............... H01L 21/6835 257/E21.508 |
| 7,777,351 B1* | 8/2010 | Berry et al. ............... 257/778 |
| 7,791,206 B2* | 9/2010 | Takeuchi et al. ............... 257/774 |
| 7,855,462 B2 | 12/2010 | Boon et al. |
| 7,858,441 B2* | 12/2010 | Lin et al. ............... 438/109 |
| 7,875,497 B2* | 1/2011 | Yoo et al. ............... 438/108 |
| 7,994,431 B2 | 8/2011 | Yamano et al. |
| 8,035,210 B2* | 10/2011 | Yang et al. ............... 257/686 |
| 8,035,211 B2* | 10/2011 | Ko et al. ............... 257/686 |
| 8,138,017 B2* | 3/2012 | Chin ............... 438/107 |
| 8,169,058 B2* | 5/2012 | Pagaila et al. ............... 257/629 |
| 8,174,119 B2 | 5/2012 | Pendse |
| 8,193,034 B2 | 6/2012 | Pagaila et al. |
| 8,304,296 B2* | 11/2012 | Ko ............... H01L 25/105 257/738 |
| 8,318,539 B2* | 11/2012 | Cho ............... H01L 21/565 257/E23.142 |
| 8,318,541 B2* | 11/2012 | Shin et al. ............... 438/113 |
| 8,354,297 B2* | 1/2013 | Pagaila et al. ............... 438/107 |
| 8,368,194 B1* | 2/2013 | Darveaux et al. ............... 257/678 |
| 8,466,544 B2 | 6/2013 | Pagaila |
| 8,502,387 B2* | 8/2013 | Choi ............... 257/774 |
| 8,609,463 B2* | 12/2013 | Ko ............... H01L 25/03 257/686 |
| 8,629,054 B2* | 1/2014 | Jeung et al. ............... 438/617 |
| 8,698,297 B2* | 4/2014 | Bae et al. ............... 257/686 |
| 8,710,668 B2* | 4/2014 | Lee et al. ............... 257/774 |
| 8,742,579 B2* | 6/2014 | Pagaila et al. ............... 257/741 |
| 8,883,561 B2* | 11/2014 | Park et al. ............... 438/107 |
| 8,895,440 B2* | 11/2014 | Choi et al. ............... 438/675 |
| 8,975,111 B2* | 3/2015 | Lin et al. ............... 438/99 |
| 2007/0108583 A1 | 5/2007 | Shim et al. |
| 2008/0136004 A1* | 6/2008 | Yang et al. ............... 257/686 |
| 2008/0246126 A1* | 10/2008 | Bowles ............... H01L 23/3114 257/659 |
| 2009/0014858 A1* | 1/2009 | Boon ............... H01L 21/4853 257/686 |
| 2009/0072375 A1* | 3/2009 | Song et al. ............... 257/686 |
| 2009/0140408 A1* | 6/2009 | Lee et al. ............... 257/686 |
| 2009/0166835 A1 | 7/2009 | Yang et al. |
| 2009/0261466 A1* | 10/2009 | Pagaila et al. ............... 257/686 |
| 2009/0273094 A1* | 11/2009 | Ha et al. ............... 257/777 |
| 2010/0006987 A1* | 1/2010 | Murugan et al. ............... 257/659 |
| 2010/0084754 A1* | 4/2010 | Yoo et al. ............... 257/686 |
| 2010/0214759 A1* | 8/2010 | Beddingfield et al. ............... 361/818 |
| 2010/0244208 A1* | 9/2010 | Pagaila et al. ............... 257/659 |
| 2010/0244222 A1* | 9/2010 | Chi et al. ............... 257/690 |
| 2010/0270656 A1* | 10/2010 | Do et al. ............... 257/620 |
| 2010/0320582 A1* | 12/2010 | Pagaila et al. ............... 257/686 |
| 2011/0037155 A1* | 2/2011 | Pagaila ............... 257/686 |
| 2011/0049695 A1* | 3/2011 | Shin et al. ............... 257/686 |
| 2011/0062549 A1* | 3/2011 | Lin ............... 257/531 |
| 2011/0068444 A1* | 3/2011 | Chi et al. ............... 257/669 |
| 2011/0068453 A1* | 3/2011 | Cho et al. ............... 257/686 |
| 2011/0140259 A1* | 6/2011 | Cho et al. ............... 257/686 |
| 2012/0018900 A1* | 1/2012 | Pagaila et al. ............... 257/774 |
| 2012/0038064 A1* | 2/2012 | Camacho et al. ............... 257/777 |
| 2012/0056329 A1 | 3/2012 | Pagaila et al. |
| 2012/0074585 A1* | 3/2012 | Koo et al. ............... 257/774 |
| 2012/0112327 A1* | 5/2012 | Pagaila ............... H01L 21/56 257/660 |
| 2012/0119388 A1 | 5/2012 | Cho et al. |
| 2012/0217645 A1 | 8/2012 | Pagaila |
| 2012/0225522 A1* | 9/2012 | Zhao et al. ............... 438/107 |
| 2012/0273960 A1* | 11/2012 | Park et al. ............... 257/774 |
| 2013/0069239 A1* | 3/2013 | Kim et al. ............... 257/774 |
| 2013/0075927 A1* | 3/2013 | Chi et al. ............... 257/774 |
| 2013/0087898 A1* | 4/2013 | Chi ............... H01L 21/4832 257/666 |
| 2013/0113098 A1* | 5/2013 | Hwang et al. ............... 257/738 |
| 2013/0175687 A1* | 7/2013 | Hu ............... 257/738 |
| 2013/0270682 A1* | 10/2013 | Hu et al. ............... 257/666 |
| 2013/0292850 A1* | 11/2013 | Chua et al. ............... 257/774 |
| 2015/0179616 A1* | 6/2015 | Lin et al. ............... 257/738 |

* cited by examiner

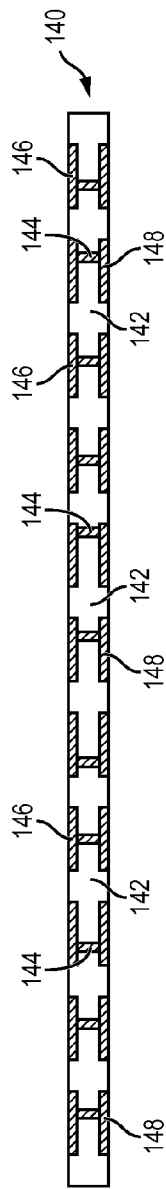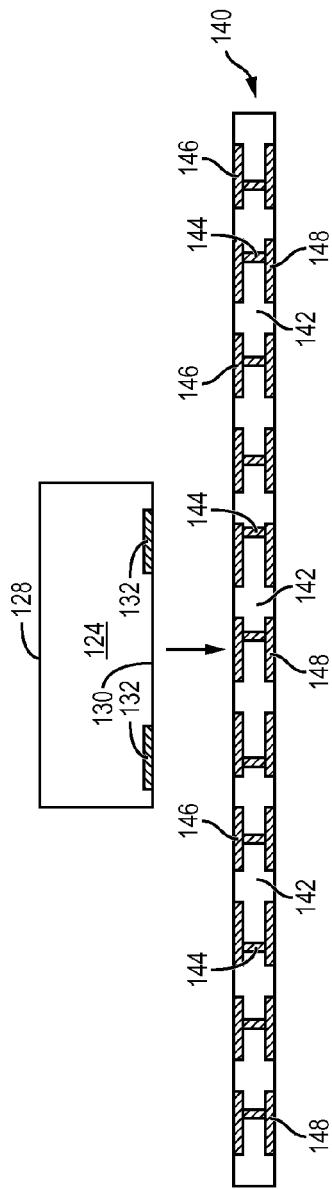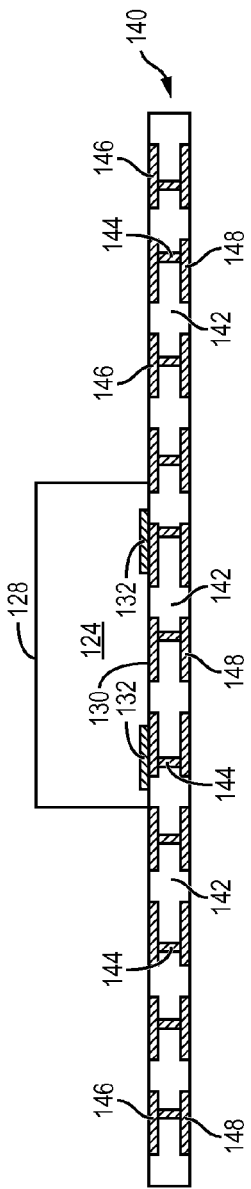

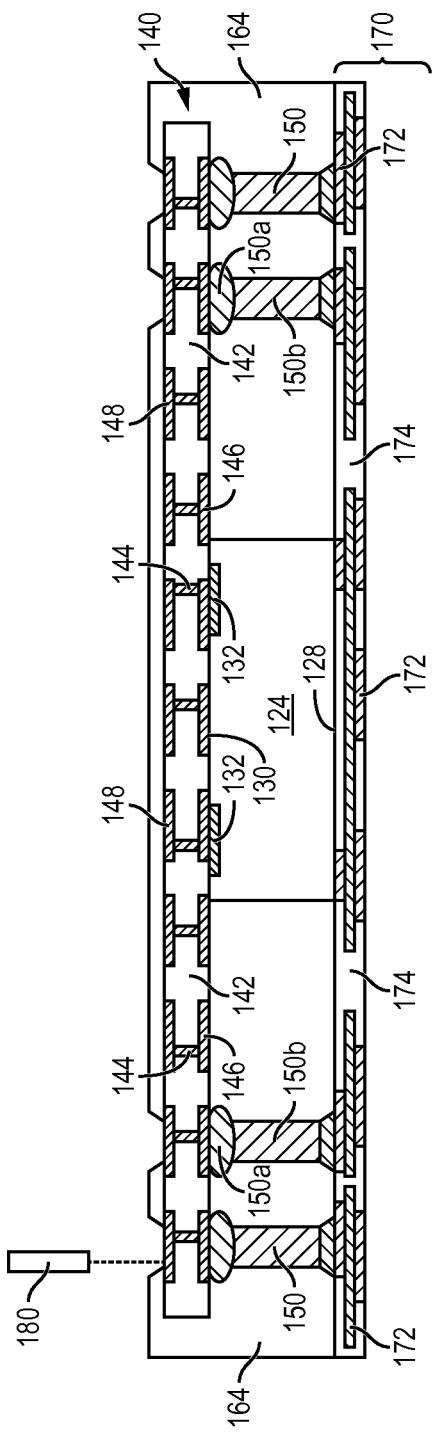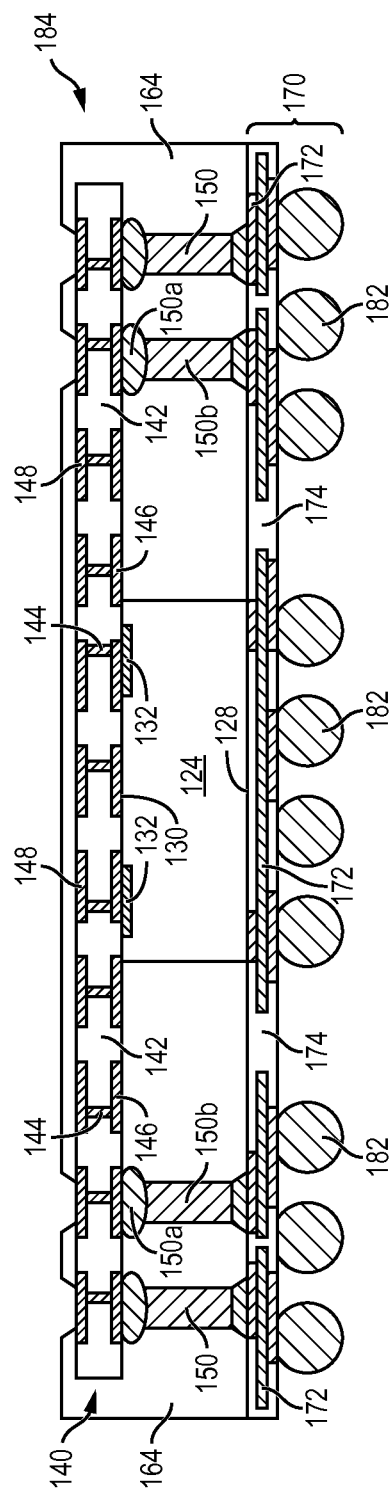

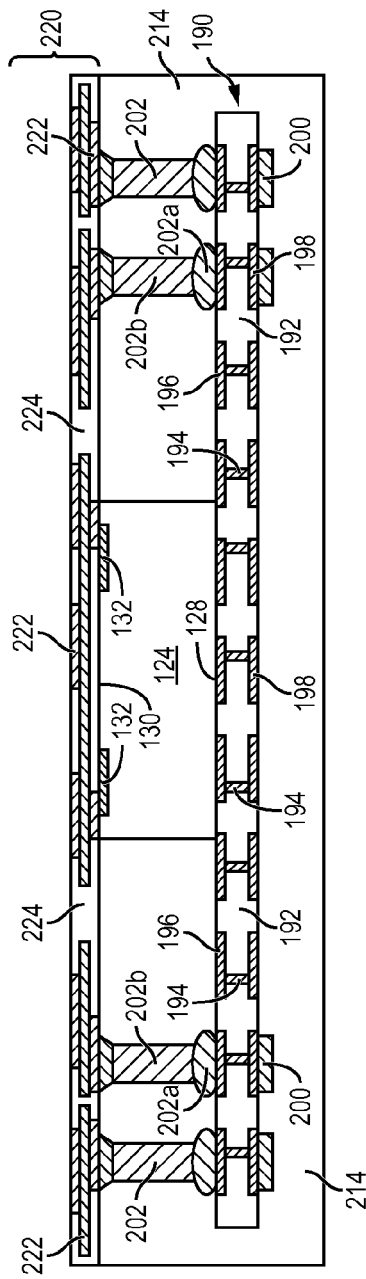
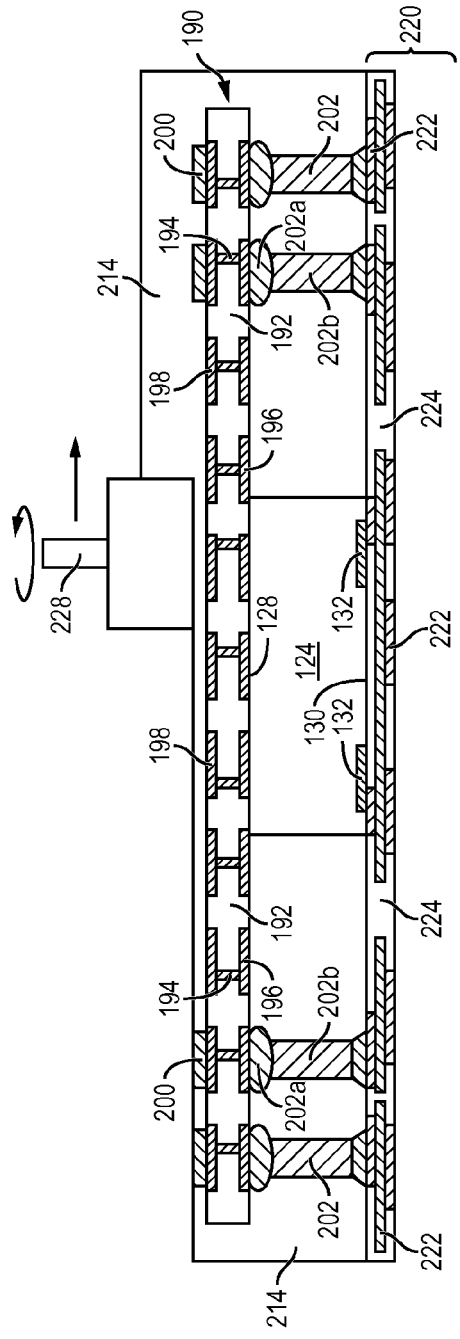

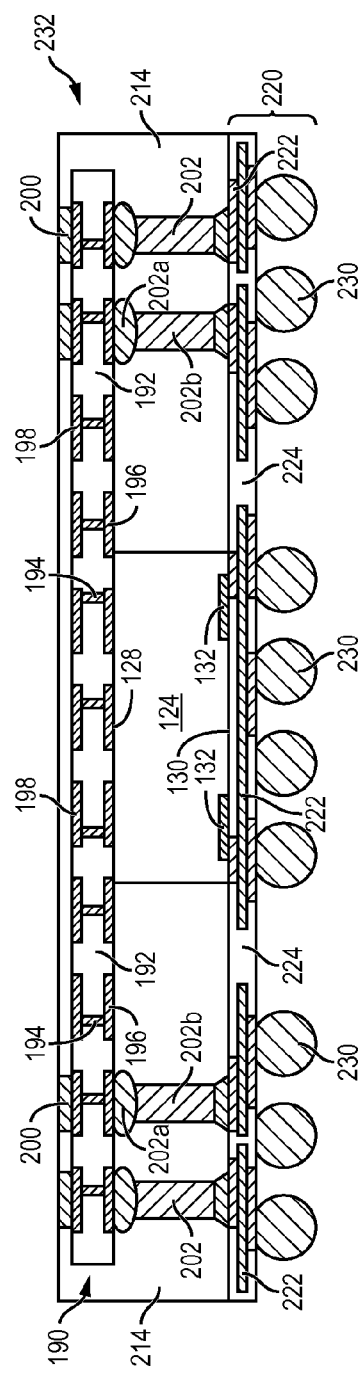

SEMICONDUCTOR DEVICE HAVING WIRE STUDS AS VERTICAL INTERCONNECT IN FO-WLP

CLAIM TO DOMESTIC PRIORITY

The present application claims the benefit of U.S. Provisional Application No. 61/701,419, filed Sep. 14, 2012, which application is incorporated herein by reference.

FIELD OF THE INVENTION

The present invention relates in general to semiconductor devices and, more particularly, to a semiconductor device and method of forming wire studs as vertical interconnect in a fan-out wafer level package (Fo-WLP).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Semiconductor packages often use conductive pillars or vias as a vertical interconnect through encapsulant around a semiconductor die, e.g., between a topside interconnect structure and bottom side interconnect structure. A via is typically formed through the encapsulant and filled with conductive material. The formation of conductive vias is time consuming and involves expensive equipment. The conductive vias may become delaminated from the topside interconnect structure and bottom side interconnect structure resulting in a manufacturing defect or latent defect.

SUMMARY OF THE INVENTION

A need exists for a simple and cost effective vertical interconnect structure in a Fo-WLP. Accordingly, in one embodiment, the present invention is a method of making a semiconductor device comprising the steps of providing a substrate, disposing a semiconductor die over a first surface of the substrate, attaching a wire stud to the first surface of the substrate, depositing an encapsulant over the substrate, semiconductor die, and wire stud, and forming an interconnect structure over the encapsulant and electrically connected to the wire stud.

In another embodiment, the present invention is a method of making a semiconductor device comprising the steps of providing a substrate, disposing a semiconductor die over the substrate, attaching a wire stud to the substrate, and depositing an encapsulant over the substrate, semiconductor die, and wire stud.

In another embodiment, the present invention is a semiconductor device comprising a substrate and semiconductor die disposed over the substrate. A wire stud is attached to the substrate. An encapsulant is deposited over the substrate, semiconductor die, and wire stud. An interconnect structure is formed over the encapsulant.

In another embodiment, the present invention is a semiconductor device comprising a substrate and semiconductor die disposed over the substrate. A wire stud is attached to the substrate. An encapsulant is deposited over the substrate, semiconductor die, and wire stud.

BRIEF DESCRIPTION OF THE DRAWINGS

FIGS. 4a-4k illustrate a process of forming wire studs as vertical interconnect in a Fo-WLP;

FIGS. 6a-6i illustrate another process of forming wire studs as vertical interconnect in a Fo-WLP;

FIGS. 7a-7b illustrate an PoP arrangement with the Fo-WLP having wire studs as vertical interconnect.

DETAILED DESCRIPTION OF THE DRAWINGS

Figure 1:
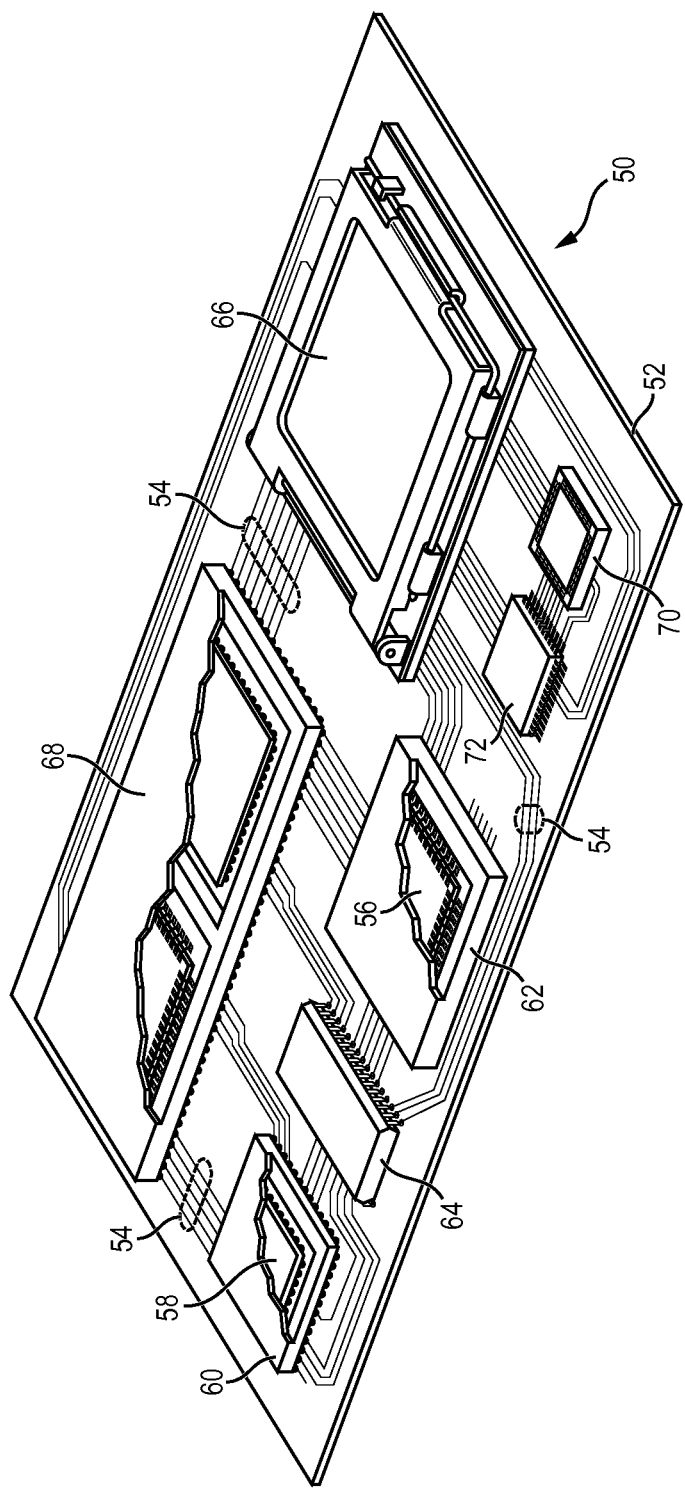
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
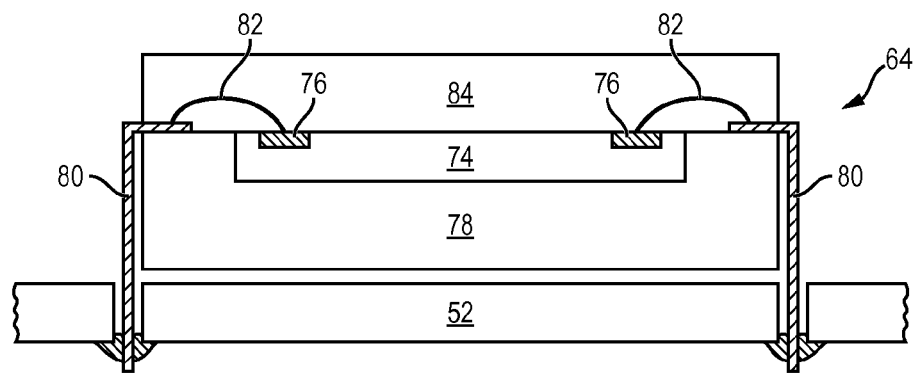
FIGS. 2a-2c illustrate further detail of the representative semiconductor packages mounted to the PCB.
Figure 2B:
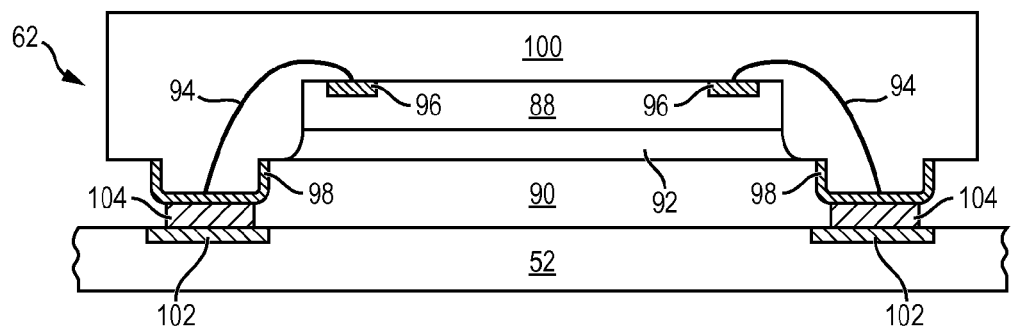
Figure 2C:
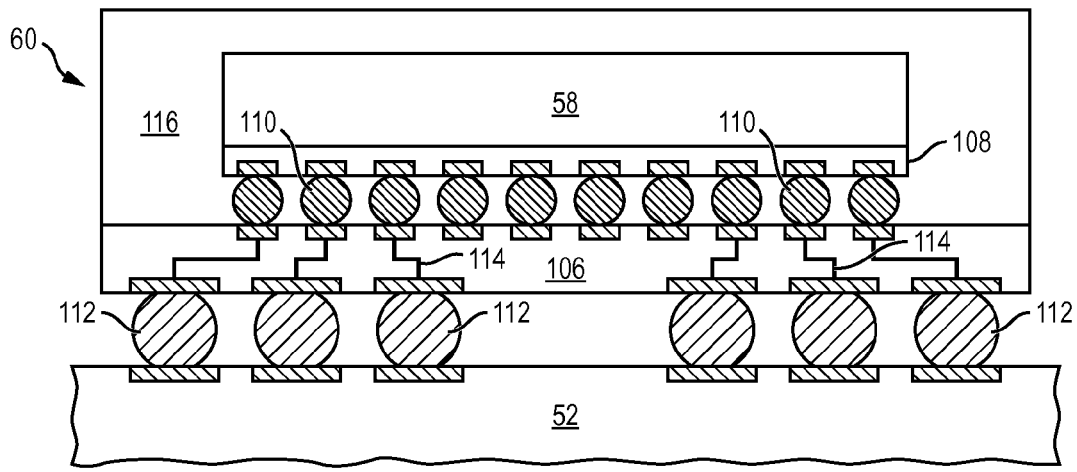

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
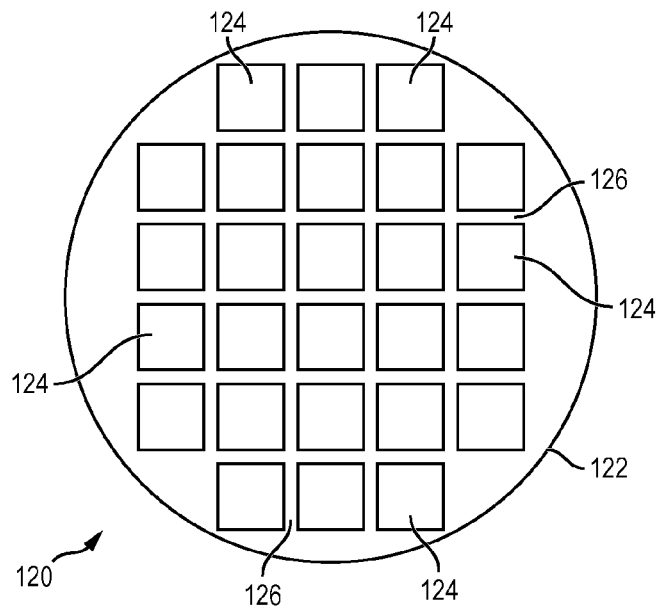
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
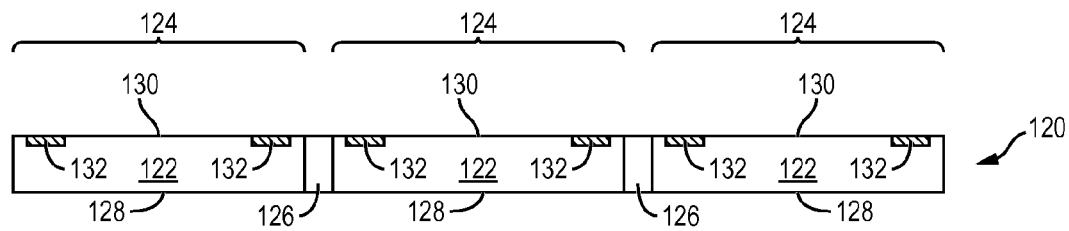

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a ball grid array (BGA) type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Figure 3C:
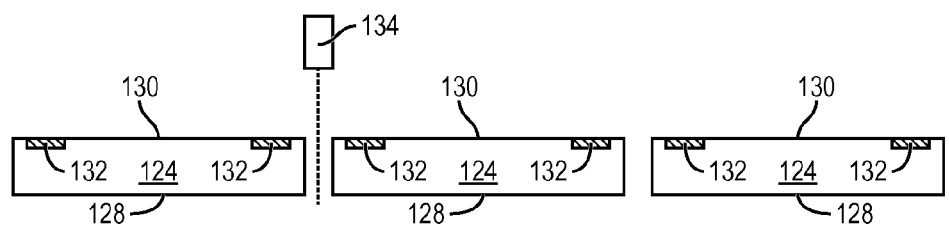

In FIG. 3c, semiconductor wafer 120 is singulated through saw street 126 using a saw blade or laser cutting tool 134 into individual semiconductor die 124.

Figure 4D:
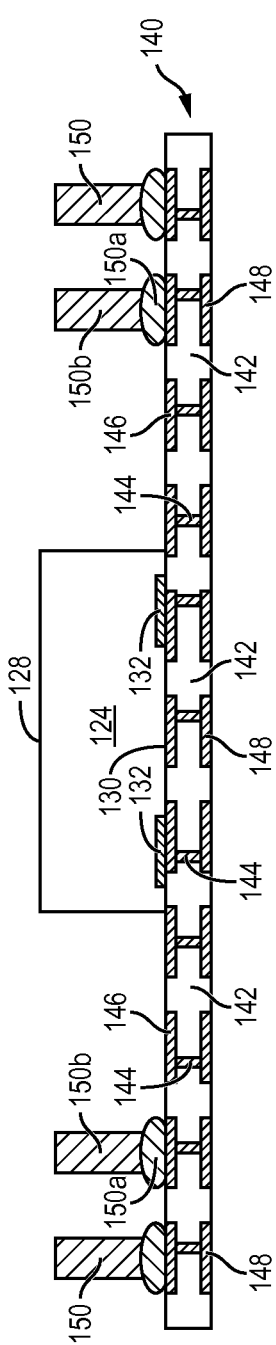

FIGS. 4a-4k illustrate, in relation to FIGS. 1 and 2a-2c, a process of forming wire studs as a vertical interconnect between a substrate and build-up interconnect structure in a Fo-WLP. FIG. 4a shows an interposer substrate 140 including one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Alternatively, substrate 140 contains one or more insulating or dielectric layers 142.

A plurality of vias is formed through substrate 140 using laser drilling, mechanical drilling, or deep reactive ion etching (DRIE). The vias are filled with Al, Cu, Sn, Ni, Au, Ag, titanium (Ti), tungsten (W), or other suitable electrically conductive material using electrolytic plating, electroless plating process, or other suitable deposition process to form z-direction vertical interconnect conductive vias 144.

An electrically conductive layer or redistribution layer (RDL) 146 is formed over a first surface of substrate 140 and conductive vias 144 using a patterning and metal deposition process such as printing, PVD, CVD, sputtering, electrolytic plating, and electroless plating. Conductive layer 146 includes one or more layers of Al, Cu, Sn, Ni, Au, Ag, or other suitable electrically conductive material. Conductive layer 146 is electrically connected to conductive vias 144.

An electrically conductive layer or RDL 148 is formed over a second surface of substrate 140 opposite the first surface and conductive vias 144 using a patterning and metal deposition process such as printing, PVD, CVD, sputtering, electrolytic plating and electroless plating. Conductive layer 148 includes one or more layers of Al, Cu, Sn, Ni, Au, Ag, or other suitable electrically conductive material. Conductive layer 148 is electrically connected to conductive vias 144 and conductive layer 146. In another embodiment, conductive vias 144 are formed through substrate 140 after forming conductive layer 146 and/or conductive layer 148.

The resulting interposer substrate 140 provides electrical interconnect vertically and laterally across the substrate through conductive layers 146 and 148 and conductive vias 144 according to the electrical function of semiconductor die 124. Portions of conductive layers 146 and 148 and conductive vias 144 are electrically common or electrically isolated according to the design and function of semiconductor die 124.

Substrate 140 can also be a multi-layer flexible laminate, ceramic, copper foil, glass, or semiconductor wafer including an active surface containing one or more transistors, diodes, and other circuit elements to implement analog circuits or digital circuits.

In FIG. 4b, semiconductor die 124 from FIG. 3c is mounted to interposer substrate 140 using, for example, a pick and place operation with active surface 130 oriented toward the substrate. Semiconductor die 124 are secured to substrate 140 with a die attach adhesive, such as epoxy resin. Conductive layer 132 of semiconductor die 124 is electrically connected to conductive layer 146 of substrate 140. FIG. 4c shows semiconductor die 124 mounted to substrate 140.

In FIG. 4d, a plurality of wire studs 150 is attached to substrate 140 by compression bonding, stitch bonding, or ball bonding in a form free air ball (FAB) or loop profile. Wire studs 150 compress upon contact with conductive layer 146 shown as base portion 150a. Stem 150b can be cut to the proper length, e.g., 250-500 micrometers (μm). Wire studs 150 provide a z-direction vertical interconnect structure.

Figure 4E:
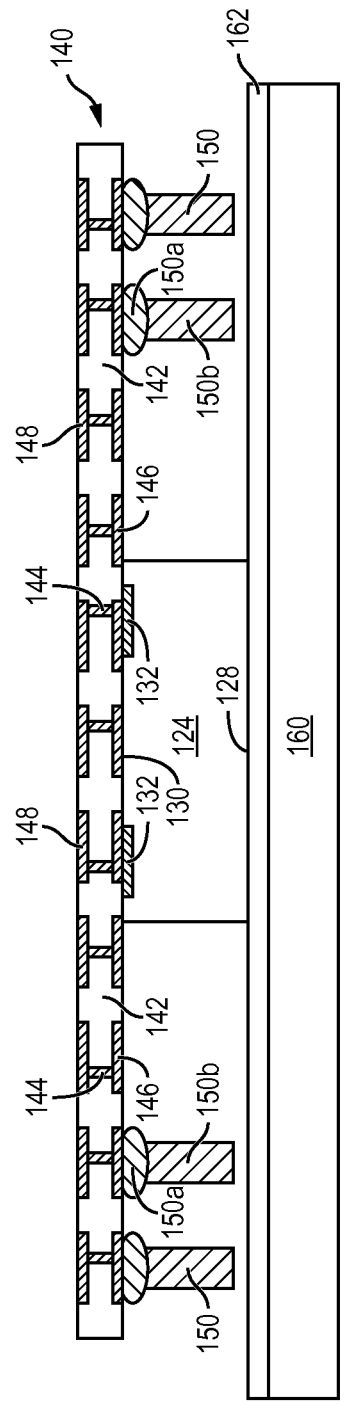

FIG. 4e shows a carrier or temporary substrate 160 containing sacrificial base material such as silicon, polymer, beryllium oxide, glass, or other suitable low-cost, rigid material for structural support. An interface layer or double-sided tape 162 is formed over carrier 160 as a temporary adhesive bonding film, etch-stop layer, or thermal release layer. The substrate, semiconductor die, and wire studs assembly from FIG. 4d is inverted and mounted to carrier 160 and interface layer 162. Wire studs 150 can be the same height as semiconductor die 124 or a lesser height than the semiconductor die to avoid bending the wire studs during mounting to carrier 160. Wire studs 150 can also be a greater height than semiconductor die 124. Wire studs 150 have sufficient diameter to remain rigid and stable during subsequent manufacturing processes.

Figure 4F:
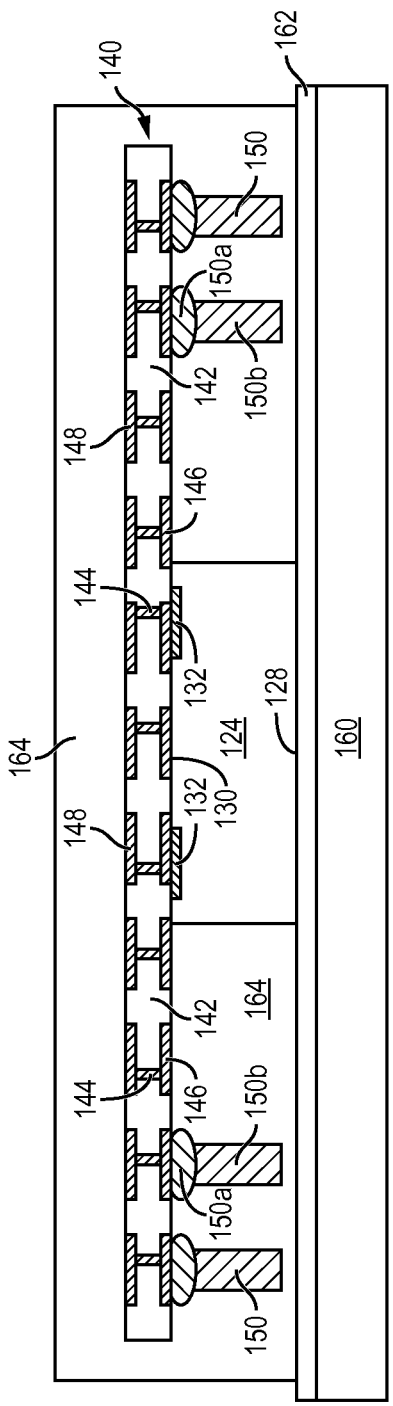

In FIG. 4f, an encapsulant or molding compound 164 is deposited over carrier 160 and around substrate 140, semiconductor die 124, and wire studs 150 using a paste printing, compressive molding, transfer molding, liquid encapsulant molding, vacuum lamination, spin coating, or other suitable applicator. Encapsulant 164 can be polymer composite material, such as epoxy resin with filler, epoxy acrylate with filler, or polymer with proper filler. Encapsulant 164 is non-conductive and environmentally protects the semiconductor device from external elements and contaminants.

Figure 4G:
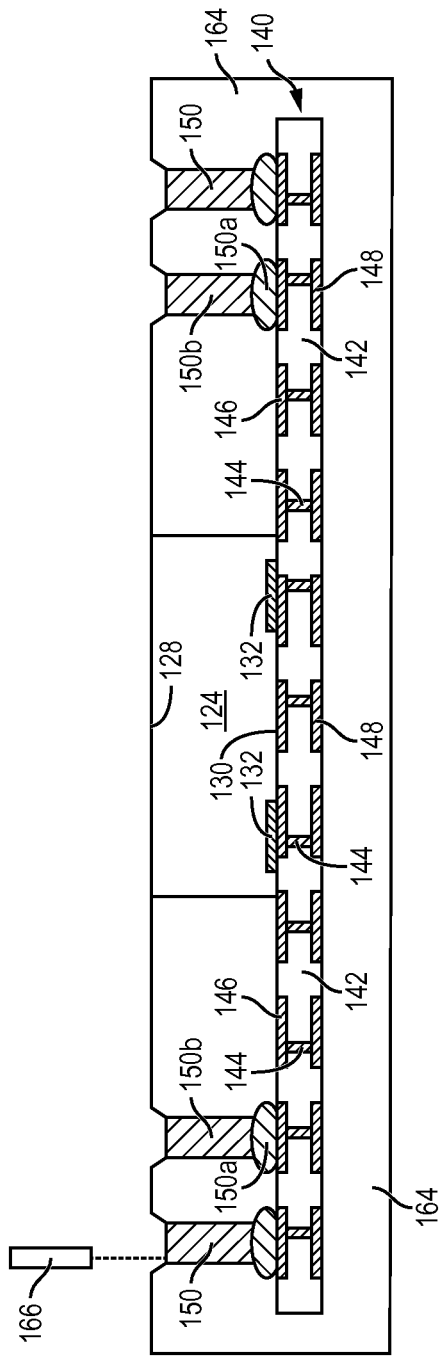

In FIG. 4g, carrier 160 and interface layer 162 are removed by chemical etching, mechanical peeling, chemical mechanical planarization (CMP), mechanical grinding, thermal bake, UV light, laser scanning, or wet stripping. The substrate, semiconductor die, and wire studs assembly is inverted.

A portion of encapsulant 164 is removed by shallow depth laser direct ablation (LDA) using laser 166 to expose stem 150b of wire studs 150. Alternatively, a portion of encapsulant 164 is removed by an etching process through a patterned photoresist layer to expose wire studs 150. The exposure of wire studs 150 may not be necessary if the wire studs are already exposed by nature of being the same height or greater height as semiconductor die 124.

Figure 4H:
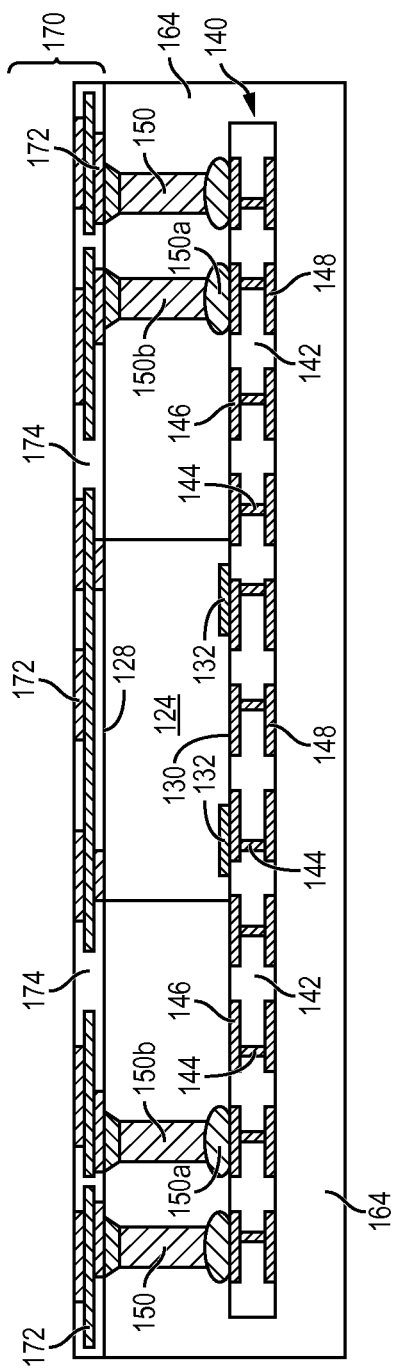

In FIG. 4h, a build-up interconnect structure 170 is formed over encapsulant 164 and semiconductor die 124. The build-up interconnect structure 170 includes an electrically conductive layer or RDL 172 formed using a patterning and metal deposition process such as sputtering, electrolytic plating, and electroless plating. Conductive layer 172 can be one or more layers of Al, Cu, Sn, Ni, Au, Ag, or other suitable electrically conductive material. One portion of conductive layer 172 extends into the removed portion of encapsulant 164 that exposes wire studs 150 to electrically connect to the wire studs. Other portions of conductive layer 172 can be electrically common or electrically isolated depending on the design and function of semiconductor die 124.

The build-up interconnect structure 170 further includes an insulating or passivation layer 174 formed over encapsulant 164 and semiconductor die 124 and around conductive layer 172 for electrical isolation using PVD, CVD, printing, spin coating, spray coating, sintering or thermal oxidation. The insulating layer 174 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties.

Figure 4I:
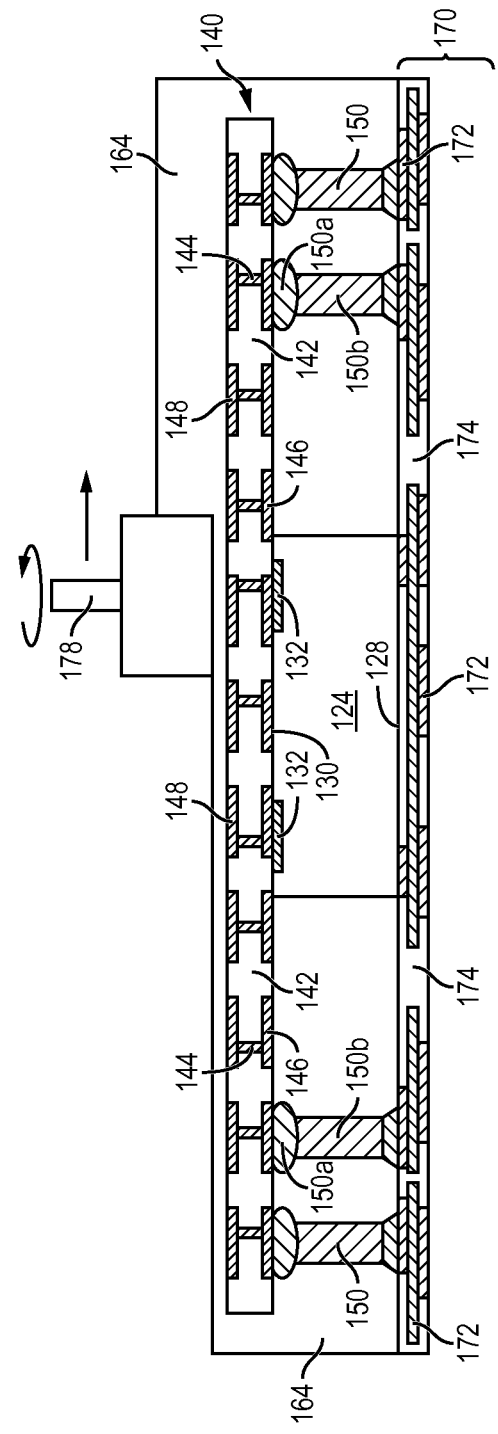

In FIG. 4i, a portion of encapsulant 164 opposite interconnect structure 170 undergoes a grinding operation with grinder 178 to planarize the surface and reduce a thickness of the encapsulant. A chemical etch or CMP process can also be used to remove mechanical damage resulting from the grinding operation and planarize encapsulant 164. The reduced thickness of encapsulant 164 remains covering substrate 140 to protect conductive layer 148.

In FIG. 4j, a portion of encapsulant 164 is removed by shallow depth LDA using laser 180 to expose conductive layer 148 of substrate 140 for electrical interconnect to other semiconductor devices, as discussed in FIGS. 7a-7b and 8a-8b.

In FIG. 4k, an electrically conductive bump material is deposited over conductive layer 172 using an evaporation, electrolytic plating, electroless plating, ball drop, or screen printing process. The bump material can be Al, Sn, Ni, Au, Ag, lead (Pb), Bi, Cu, solder, and combinations thereof, with an optional flux solution. For example, the bump material can be eutectic Sn/Pb, high-lead solder, or lead-free solder. The bump material is bonded to conductive layer 172 using a suitable attachment or bonding process. In one embodiment, the bump material is reflowed by heating the material above its melting point to form balls or bumps 182. In some applications, bumps 182 are reflowed a second time to improve electrical contact to conductive layer 172. In one embodiment, bumps 182 are formed over a UBM having a wetting layer, barrier layer, and adhesive layer. The bumps can also be compression bonded or thermocompression bonded to conductive layer 172. Bumps 182 represent one type of interconnect structure that can be formed over conductive layer 172. The interconnect structure can also use bond wires, conductive paste, stud bump, micro bump, or other electrical interconnect.

Fo-WLP 184 uses wire studs 150 for vertical electrical interconnect between substrate 140 and build-up interconnect structure 170. Wire studs 150 simplify the manufacturing process to reduce cost and reduce delamination issues with the vertical interconnect structure in the Fo-WLP.

Figure 5:
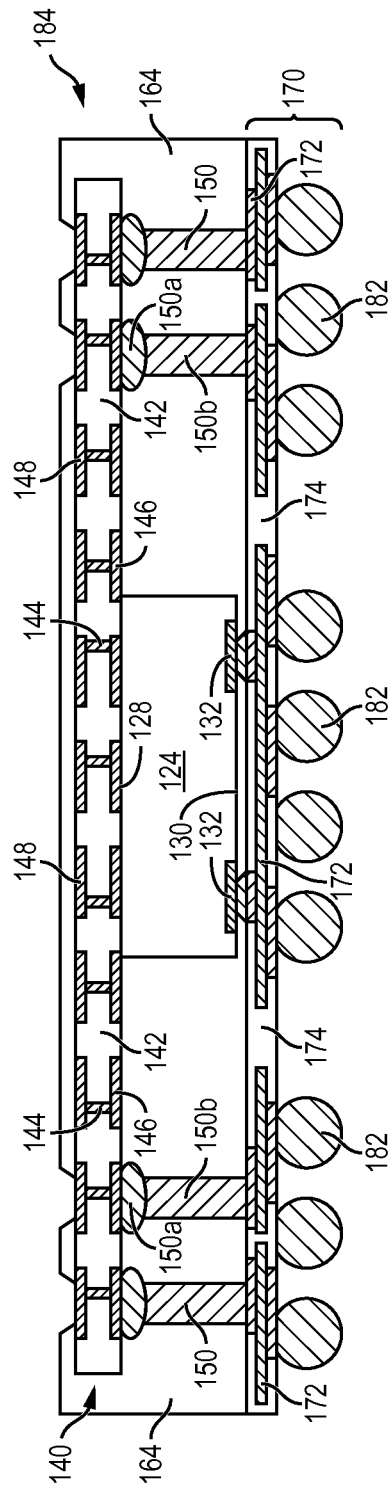
FIG. 5 illustrates an opposing orientation of the semiconductor die in the Fo-WLP.

FIG. 5 shows an embodiment with semiconductor die 124 mounted back surface 128 to interposer substrate 140. If necessary, a portion of encapsulant 164 is removed by LDA to expose conductive layer 132, similar to FIG. 4g. A portion of conductive layer 172 extends into the removed portion of encapsulant 164 that exposes conductive layer 132 of semiconductor die 124 to electrically connect to the semiconductor die, similar to FIG. 4h.

Figure 6A:
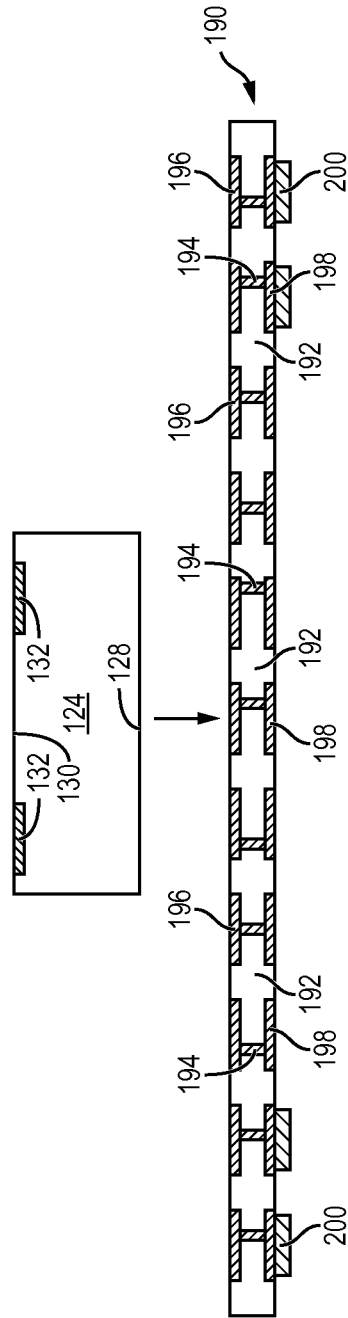

FIGS. 6a-6i illustrate, in relation to FIGS. 1 and 2a-2c, another process of forming wire studs as a vertical interconnect between a substrate and build-up interconnect structure in a Fo-WLP. FIG. 6a shows an interposer substrate 190 including one or more laminated layers of polytetrafluoroethylene prepreg, FR-4, FR-1, CEM-1, or CEM-3 with a combination of phenolic cotton paper, epoxy, resin, woven glass, matte glass, polyester, and other reinforcement fibers or fabrics. Alternatively, substrate 190 contains one or more insulating or dielectric layers 192.

A plurality of vias is formed through substrate 190 using laser drilling, mechanical drilling, or DRIE. The vias are filled with Al, Cu, Sn, Ni, Au, Ag, Ti, W, or other suitable electrically conductive material using electrolytic plating, electroless plating process, or other suitable deposition process to form z-direction vertical interconnect conductive vias 194.

An electrically conductive layer or RDL 196 is formed over a first surface of substrate 190 and conductive vias 194 using a patterning and metal deposition process such as printing, PVD, CVD, sputtering, electrolytic plating, and electroless plating. Conductive layer 196 includes one or more layers of Al, Cu, Sn, Ni, Au, Ag, or other suitable electrically conductive material. Conductive layer 196 is electrically connected to conductive vias 194.

An electrically conductive layer or RDL 198 is formed over a second surface of substrate 190 opposite the first surface and conductive vias 194 using a patterning and metal deposition process such as printing, PVD, CVD, sputtering, electrolytic plating and electroless plating. Conductive layer 198 includes one or more layers of Al, Cu, Sn, Ni, Au, Ag, or other suitable electrically conductive material. Conductive layer 198 is electrically connected to conductive vias 194 and conductive layer 196. In another embodiment, conductive vias 194 are formed through substrate 190 after forming conductive layer 196 and/or conductive layer 198.

An electrically conductive layer 200 is formed over conductive layer 198 outside the mounting site of semiconductor die 124 using a patterning and metal deposition process such as printing, PVD, CVD, sputtering, electrolytic plating and electroless plating. Conductive layer 200 includes one or more layers of Al, Cu, Sn, Ni, Au, Ag, or other suitable electrically conductive material. Conductive layer 200 operates as a bonding pad electrically connected to conductive layer 198 and conductive vias 194.

The resulting interposer substrate 190 provides electrical interconnect vertically and laterally across the substrate through conductive layers 196 and 198 and conductive vias 194 according to the electrical function of semiconductor die 124. Portions of conductive layers 196 and 198 and conductive vias 194 are electrically common or electrically isolated according to the design and function of semiconductor die 124.

Substrate 190 can also be a multi-layer flexible laminate, ceramic, copper foil, glass, or semiconductor wafer including an active surface containing one or more transistors, diodes, and other circuit elements to implement analog circuits or digital circuits.

Figure 6B:
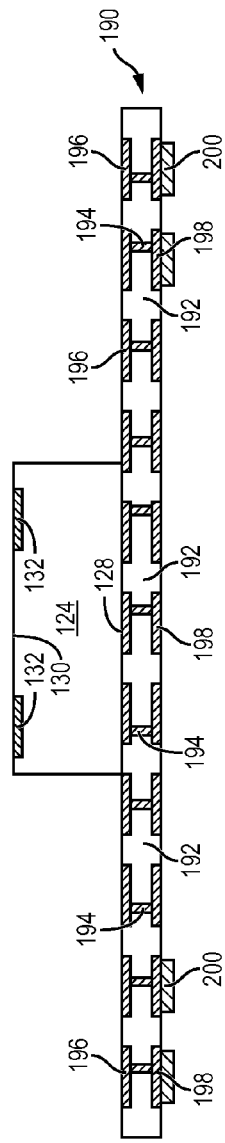

Semiconductor die 124 from FIG. 3c is mounted to interposer substrate 190 using, for example, a pick and place operation with back surface 128 oriented toward the substrate. Semiconductor die 124 are secured to substrate 190 with a die attach adhesive, such as epoxy resin. FIG. 6b shows semiconductor die 124 mounted to substrate 190.

Figure 6C:
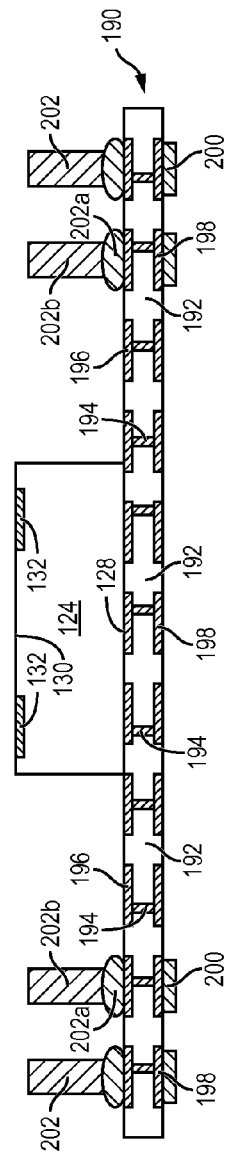

In FIG. 6c, a plurality of wire studs 202 are attached to substrate 190 by compression bonding, stitch bonding, or ball bonding in a form FAB or loop profile. Wire studs 202 compress upon contact with conductive layer 196 shown as base portion 202a. Stem 202b can be cut to the proper length, e.g., 250-500 µm. Wire studs 202 provide a z-direction vertical interconnect structure.

Figure 6D:
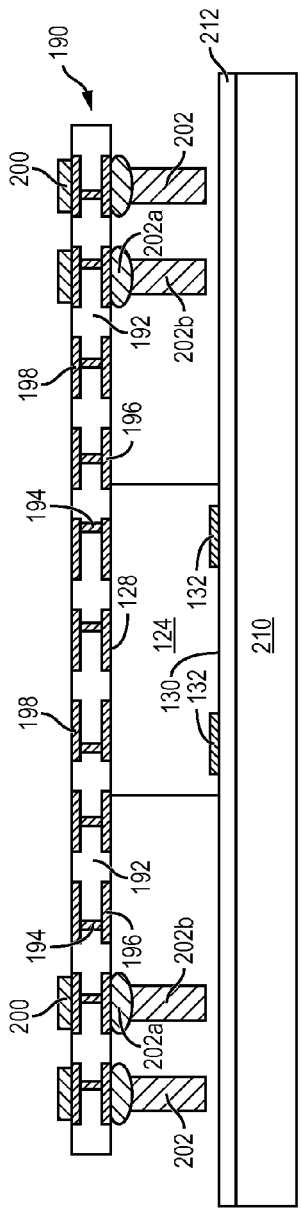

FIG. 6d shows a carrier or temporary substrate 210 containing sacrificial base material such as silicon, polymer, beryllium oxide, glass, or other suitable low-cost, rigid material for structural support. An interface layer or double-sided tape 212 is formed over carrier 210 as a temporary adhesive bonding film, etch-stop layer, or thermal release layer. The substrate, semiconductor die, and wire studs assembly from FIG. 6c is inverted and mounted to carrier 210 and interface layer 212. Wire studs 202 can be the same height as semiconductor die 124 or a lesser height than the semiconductor die to avoid bending the wire studs during mounting to carrier 190. Wire studs 202 can also be a greater height than semiconductor die 124. Wire studs 202 have sufficient diameter to remain rigid and stable during subsequent manufacturing processes.

Figure 6E:
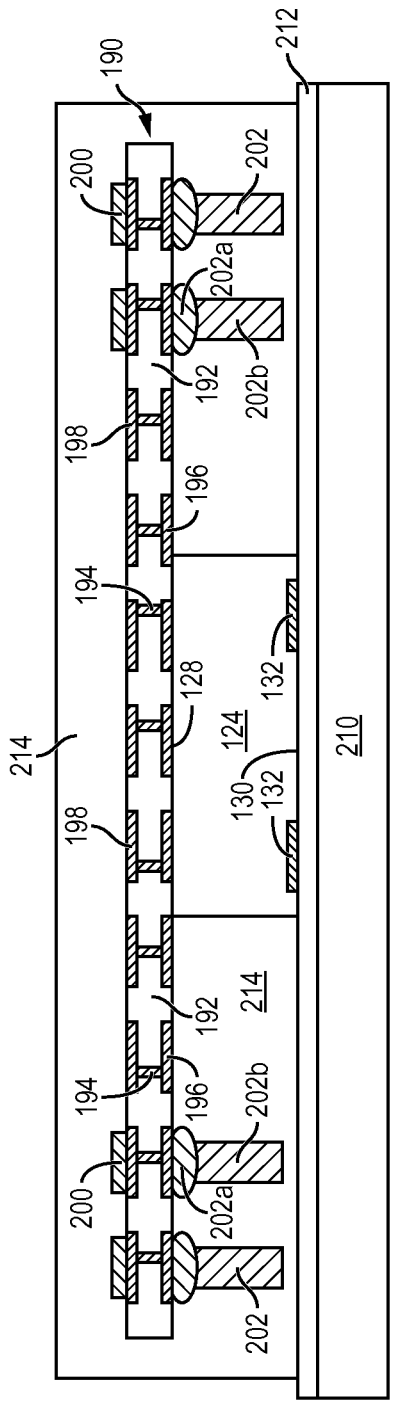

In FIG. 6e, an encapsulant or molding compound 214 is deposited over carrier 210 and around substrate 190, semiconductor die 124, and wire studs 202 using a paste printing, compressive molding, transfer molding, liquid encapsulant molding, vacuum lamination, spin coating, or other suitable applicator. Encapsulant 214 can be polymer composite material, such as epoxy resin with filler, epoxy acrylate with filler, or polymer with proper filler. Encapsulant 214 is non-conductive and environmentally protects the semiconductor device from external elements and contaminants.

Figure 6F:
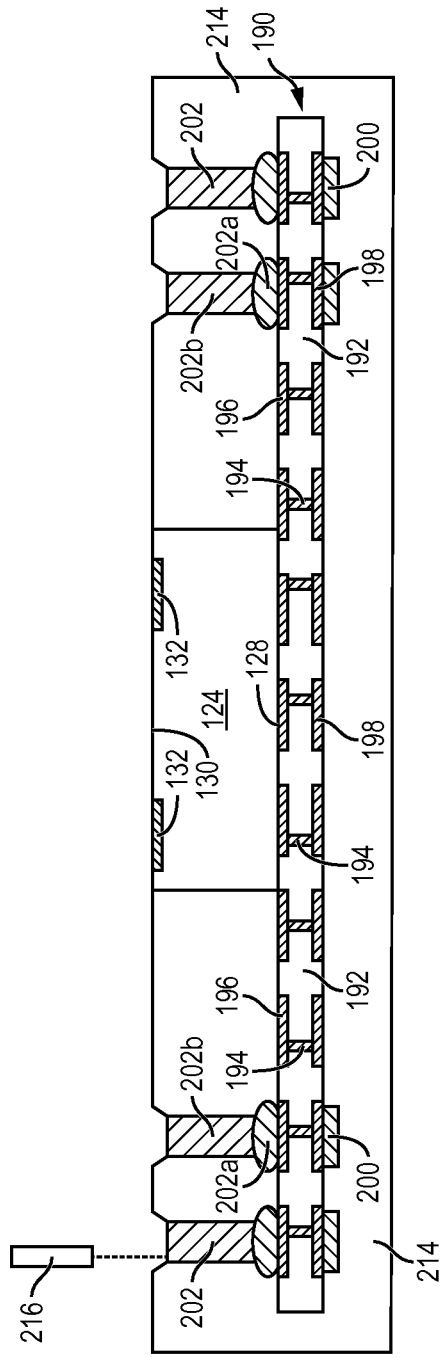

In FIG. 6f, carrier 210 and interface layer 212 are removed by chemical etching, mechanical peeling, CMP, mechanical grinding, thermal bake, UV light, laser scanning, or wet stripping. The substrate, semiconductor die, and wire studs assembly is inverted.

A portion of encapsulant 214 is removed by shallow depth LDA using laser 216 to expose stem 202b of wire studs 202. Alternatively, a portion of encapsulant 214 is removed by an etching process through a patterned photoresist layer to expose wire studs 202. The exposure of wire studs 202 may not be necessary if the wire studs are already exposed by nature of being the same height or greater height as semiconductor die 124. If necessary, a portion of encapsulant 164 is also removed by shallow depth LDA using laser 216 to expose conductive layer 132 of semiconductor die 124.

In FIG. 6g, a build-up interconnect structure 220 is formed over encapsulant 214 and semiconductor die 124. The build-up interconnect structure 220 includes an electrically conductive layer or RDL 222 formed using a patterning and metal deposition process such as sputtering, electrolytic plating, and electroless plating. Conductive layer 222 can be one or more layers of Al, Cu, Sn, Ni, Au, Ag, or other suitable electrically conductive material. One portion of conductive layer 222 extends into the removed portion of encapsulant 214 that exposes wire studs 202 to electrically connect to the wire studs. Another portion of conductive layer 222 is electrically connected to conductive layer 132 of semiconductor die 124. Other portions of conductive layer 222 can be electrically common or electrically isolated depending on the design and function of semiconductor die 124.

The build-up interconnect structure 220 further includes an insulating or passivation layer 224 formed over encapsulant 214 and semiconductor die 124 and around conductive layer 222 for electrical isolation using PVD, CVD, printing, spin coating, spray coating, sintering or thermal oxidation. The insulating layer 224 contains one or more layers of SiO2, Si3N4, SiON, Ta2O5, Al2O3, or other material having similar insulating and structural properties.

In FIG. 6h, a portion of encapsulant 214 opposite interconnect structure 220 undergoes a grinding operation with grinder 228 to planarize the surface and reduce a thickness of the encapsulant and expose conductive layer 200. A chemical etch or CMP process can also be used to remove mechanical damage resulting from the grinding operation and planarize encapsulant 214. The reduced thickness of encapsulant 214 remains covering substrate 190 to protect conductive layer 198.

In FIG. 6i, an electrically conductive bump material is deposited over conductive layer 222 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 222 using a suitable attachment or bonding process. In one embodiment, the bump material is reflowed by heating the material above its melting point to form balls or bumps 230. In some applications, bumps 230 are reflowed a second time to improve electrical contact to conductive layer 222. In one embodiment, bumps 230 are formed over a UBM having a wetting layer, barrier layer, and adhesive layer. The bumps can also be compression bonded or thermocompression bonded to conductive layer 222. Bumps 230 represent one type of interconnect structure that can be formed over conductive layer 222. The interconnect structure can also use bond wires, conductive paste, stud bump, micro bump, or other electrical interconnect.

Figure 7B:
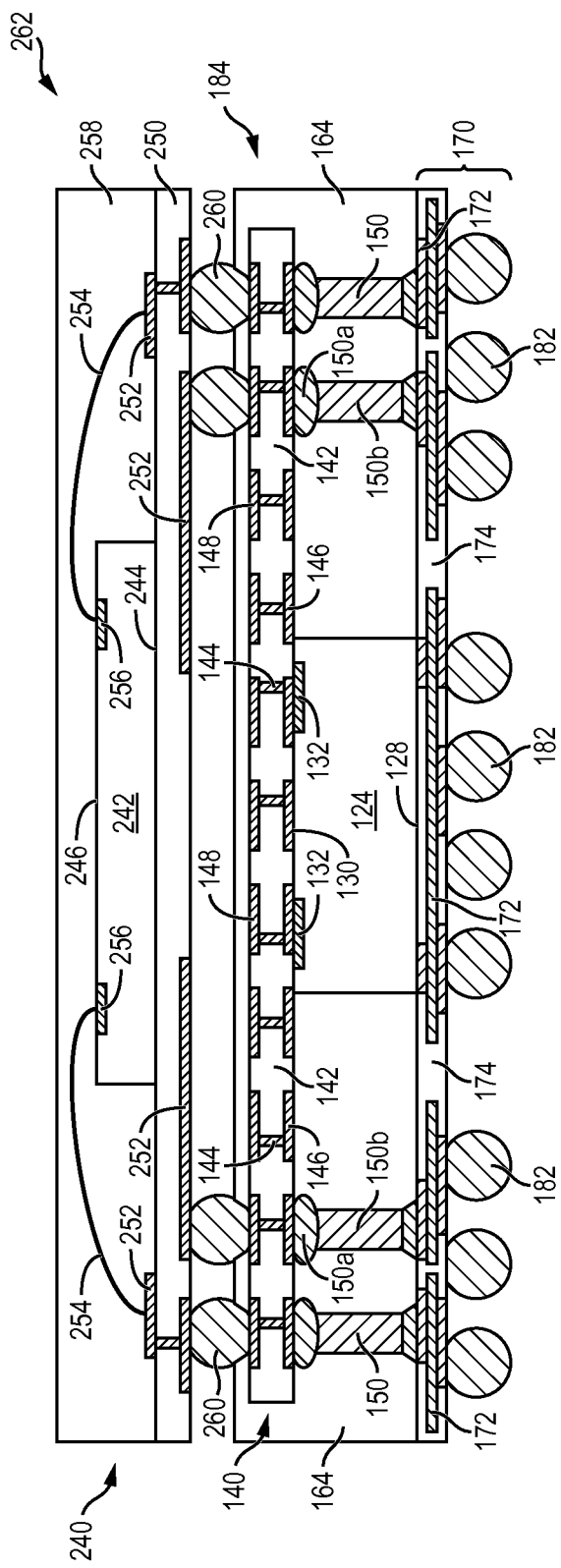

Fo-WLP 232 uses wire studs 202 for vertical electrical interconnect between substrate 190 and build-up interconnect structure 220. Wire studs 202 simplify the manufacturing process to reduce cost and reduce delamination issues with the vertical interconnect structure in the Fo-WLP FIGS. 7a-7b show an embodiment for stacking semiconductor packages in a package-on-package (PoP) arrangement. In FIG. 7a, semiconductor package 240 includes semiconductor die or component 242 with back surface 244 and active surface 246 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 246 to implement analog circuits or digital circuits, such as DSP, ASIC, memory, or other signal processing circuit. Semiconductor die 242 may also contain IPDs, such as inductors, capacitors, and resistors, for RF signal processing. In one embodiment, semiconductor die 242 is a BGA or land grid array (LGA) type device.

Semiconductor die 242 is mounted to substrate 250, which includes conductive traces 252. A plurality of bond wires 254 is connected between contact pads 256 formed on active surface 246 of semiconductor die 242 and conductive traces 252 of substrate 250. An encapsulant 258 is deposited over semiconductor die 242, substrate 250, and bond wires 254. Bumps 260 are formed over conductive traces 252 of substrate 250 opposite semiconductor die 242.

FIG. 7b shows semiconductor package 240 mounted to Fo-WLP 184 from FIG. 4k with bumps 260 bonded to conductive layer 148 of substrate 140 as PoP 262.

Figure 8A:
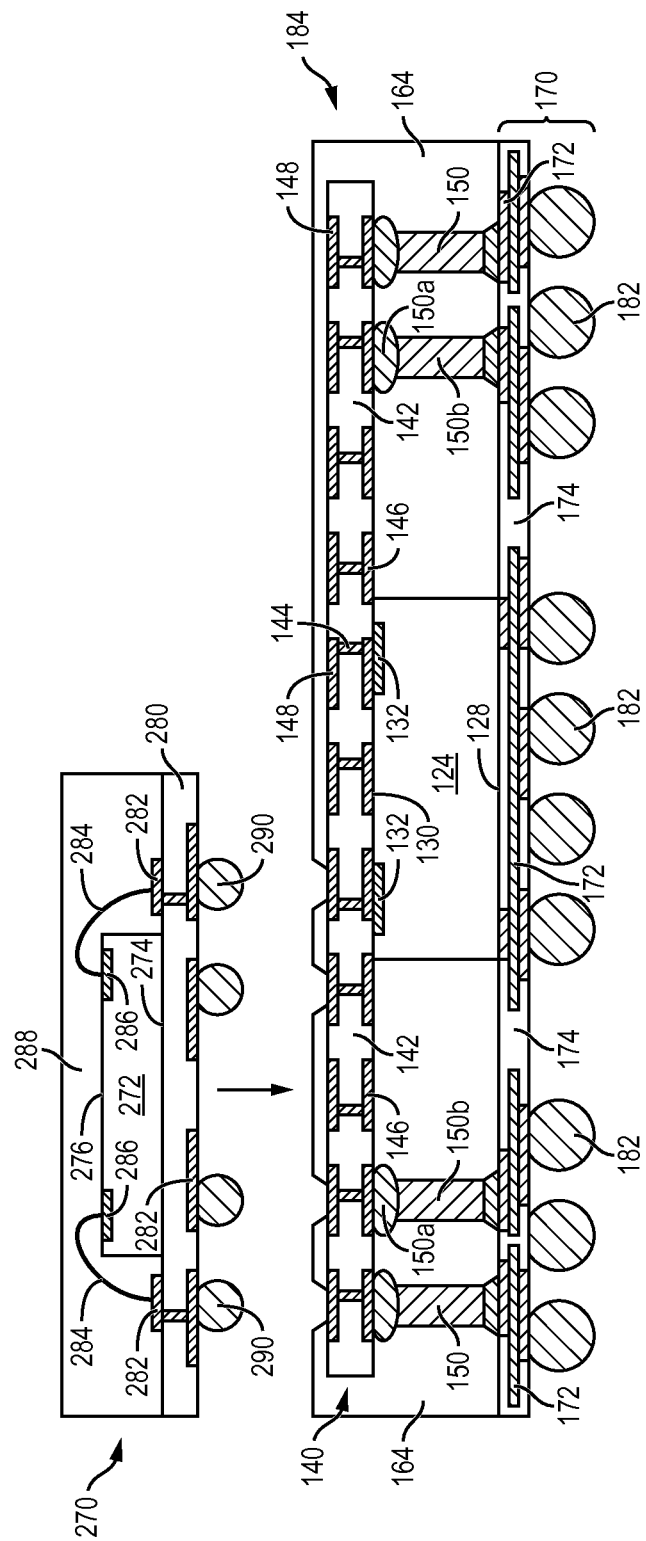
FIGS. 8a-8b illustrate a SiP arrangement with the Fo-WLP having wire studs as vertical interconnect.
Figure 8B:
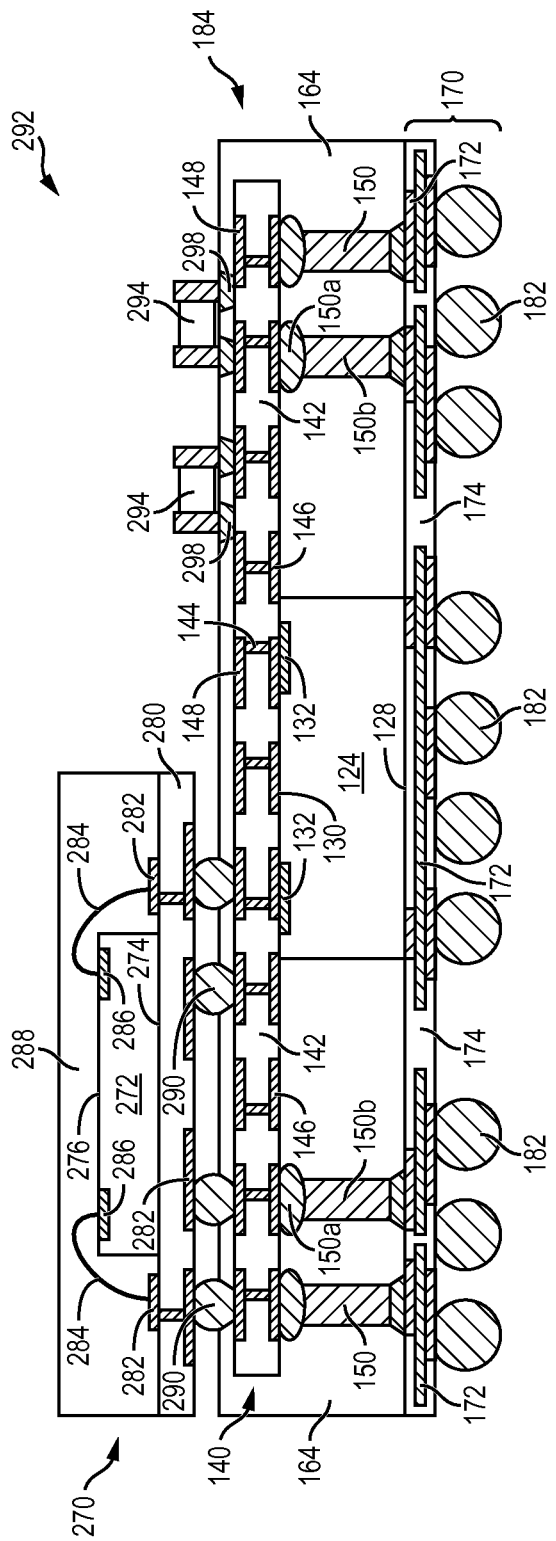

FIGS. 8a-8b show another embodiment for stacking semiconductor packages in a PoP or system-in-package (SiP) arrangement. In FIG. 8a, semiconductor package 270 includes semiconductor die or component 272 with back surface 274 and active surface 276 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 276 to implement analog circuits or digital circuits, such as DSP, ASIC, memory, or other signal processing circuit. Semiconductor die 272 may also contain IPDs, such as inductors, capacitors, and resistors, for RF signal processing. In one embodiment, semiconductor die 272 is a BGA or LGA type device.

Semiconductor die 272 is mounted to substrate 280, which includes conductive traces 282. A plurality of bond wires 284 is connected between contact pads 286 formed on active surface 276 of semiconductor die 272 and conductive traces 282 of substrate 280. An encapsulant 288 is deposited over semiconductor die 272, substrate 280, and bond wires 284. Bumps 290 are formed over conductive traces 282 of substrate 280 opposite semiconductor die 272.

FIG. 8b shows semiconductor package 270 mounted to Fo-WLP 184 from FIG. 4k with bumps 290 bonded to conductive layer 148 as SiP 292. In addition, discrete semiconductor devices 294 are disposed over encapsulant 164 and electrically connected to conductive layer 148 of substrate 140 with conductive paste 298. Discrete semiconductor devices 294 can be passive components, such as inductors, capacitors, or resistors. Discrete semiconductor devices 294 can also be active components, such as transistors or diodes.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a substrate;
   a semiconductor die mounted to a first surface of the substrate;
   a wire stud including a base and wire stem extending from the base with the base attached to the first surface of the substrate, wherein a height of the wire stud is less than or equal to a height of the semiconductor die;
   an encapsulant deposited over the semiconductor die, wire stud, the first surface of the substrate, and a second surface of the substrate opposite the first surface of the substrate; and
   an interconnect structure formed over the encapsulant and extending to the wire stud.

2. The semiconductor device of claim 1, further including a bonding pad formed over the second surface of the substrate.

3. The semiconductor device of claim 1, further including a semiconductor package disposed over the second surface of the substrate.

4. The semiconductor device of claim 1, further including a discrete semiconductor device disposed over the second surface of the substrate.

5. A semiconductor device, comprising:
   a substrate;
   a semiconductor die mounted to a first surface of the substrate;
   a wire stud including a base and wire stem extending from the base with the base attached to the first surface of the substrate, wherein a height of the wire stud is less than or equal to a height of the semiconductor die; and
   an encapsulant deposited over the semiconductor die, and wire stud, the first surface of the substrate, and a second surface of the substrate opposite the first surface of the substrate.

6. The semiconductor device of claim 5, further including an interconnect structure formed over the encapsulant.

7. The semiconductor device of claim 6, wherein the interconnect structure is electrically coupled to the wire stud.

8. The semiconductor device of claim 5, further including a bonding pad formed over the second surface of the substrate.

9. The semiconductor device of claim 8, wherein a surface of the encapsulant is coplanar with a surface of the bonding pad.

10. The semiconductor device of claim 5, further including a semiconductor package disposed over the second surface of the substrate.

11. The semiconductor device of claim 5, wherein the encapsulant is deposited over the second surface of the substrate.

12. A semiconductor device, comprising:
    a substrate;
    a semiconductor die mounted to a first surface of the substrate;
    a wire stud including a base and stem extending from the base attached to the first surface of the substrate, wherein a height of the wire stud is less than or equal to a height of the semiconductor die; and
    an encapsulant deposited over the first surface of the substrate and wire stud.

13. The semiconductor device of claim 12, further including an interconnect structure formed over the encapsulant.

14. The semiconductor device of claim 12, wherein the encapsulant is deposited over a second surface of the substrate opposite the first surface of the substrate.

15. The semiconductor device of claim 12, further including a bonding pad formed over a second surface of the substrate opposite the first surface of the substrate.

16. The semiconductor device of claim 12, further including a semiconductor package disposed over a second surface of the substrate opposite the first surface of the substrate.

* * * * *